United States Patent [19]

Suh

[11] Patent Number: 5,781,498
[45] Date of Patent: Jul. 14, 1998

[54] SUB WORD LINE DRIVING CIRCUIT AND A SEMICONDUCTOR MEMORY DEVICE USING THE SAME

[75] Inventor: Jung Won Suh, Kyoungki-do, Rep. of Korea

[73] Assignee: Hyundai Electronics Industries Co., Ltd., Ichon-shi, Rep. of Korea

[21] Appl. No.: 764,083

[22] Filed: Dec. 6, 1996

[30] Foreign Application Priority Data

Dec. 8, 1995 [KR] Rep. of Korea ............ 95-48041

[51] Int. Cl.$^6$ ............................................. G11C 8/00
[52] U.S. Cl. ............................. 365/230.06; 365/189.11
[58] Field of Search ............ 365/230.06, 189.11; 326/105, 106, 107, 108

[56] References Cited

U.S. PATENT DOCUMENTS

| | | | |
|---|---|---|---|
| 5,253,202 | 10/1993 | Bronner et al. | 365/189.01 |
| 5,317,538 | 5/1994 | Eaton Jr. | 365/189.09 |
| 5,353,257 | 10/1994 | Yanagisawa et al. | 365/230.06 |
| 5,426,333 | 6/1995 | Maeda | 327/536 |
| 5,467,316 | 11/1995 | Kim et al. | 365/230.06 |
| 5,519,665 | 5/1996 | Chishiki | 365/230.06 |
| 5,617,369 | 4/1997 | Tomishima et al. | 365/230.06 |

*Primary Examiner*—David C. Nelms
*Assistant Examiner*—Son Mai
*Attorney, Agent, or Firm*—Reid & Priest LLP

[57] ABSTRACT

A sub word line driving circuit for driving a sub word line is used for a semiconductor memory device having a hierarchical word line structure. The sub word line driving circuit includes two NMOS transistors for driving the sub word lines to reduce an area of overall memory device when being applied to a VLSI memory device of Gigabit class while there is no time loss caused by delay between driving signals heretofore required in a bootstrap process to involve high operating speed and to be favorable in a reliability aspect of the device.

17 Claims, 6 Drawing Sheets

SUB WORD LINE DRIVING CIRCUIT AND A SEMICONDUCTOR MEMORY DEVICE USING THE SAME

BACKGROUND OF THE INVENTION

1. Field of the Invention

The present invention relates to a semiconductor memory device having a hierarchical word line structure, and more particularly to a sub word line driving circuit capable of performing a high-speed operation with a small layout area, and a semiconductor memory device using the same.

2. Discussion of Related Art

A hierarchical word line structure is generally used for relieving a strict metal design rule originated from a metal strapping of a word line. The metal strapping is performed such that, in order to reduce resistance of a word line formed of a poly-silicon, a metal line is arranged onto an upper portion of a cell array in a word line pitch and is then coupled to the word line of poly-silicon, thereby reducing the resistance of the word line to speed up driving time. (Here, the pitch refers the sum of a line width and a space in the regularly arranged lines.) In the metal strapping method, since the word line pitch is decreased along with the increase of the packing density of a memory device, a failure rate of the metal process is increased to thus reduce yield. Therefore, the hierarchical word line structure is necessarily applied from the class of 16M DRAM products.

The present invention is to be applied to a portion of driving a sub word line in the hierarchical word line structure applied to memory products.

A conventional sub word line driving circuit employed for the hierarchical word line structure is generally formed by three NMOS transistors, and the sub word line is driven by a high potential Vpp which is a boosted voltage level via a double bootstrapping process. This double bootstrapping process has a node applied with a considerably high voltage to adversely affect the reliability of the device. In addition, the delay required between driving signals lengthens the driving time. Furthermore, since the layout area of the sub word line driving circuit has a great influence upon the overall memory device, the layout is required to be as small as possible.

FIG. 1 is a detailed circuit diagram showing the conventional sub word line driving circuit which includes an NMOS transistor MN3 coupled between a main word line MWL and a node N1 and supplied with a potential signal Vx (which is a DC voltage that typically equals Vcc) via a gate thereof. Also, an NMOS transistor MN1 coupled between a node N2 for receiving an operating signal px and a sub word line SWL has a gate coupled to node N1, and an NMOS transistor MN2 coupled between sub word line SWL and a ground voltage Vss has a gate coupled to a complement main word line /MWL.

Main pull-up transistor MN1 functions by pulling up sub word line SWL to the Vpp level (which is higher than a power source voltage within a memory chip), and pull-down transistor MN2 pulls down it to 0 V (ground voltage). Also, NMOS transistor MN3 serves as a switch for maintaining the potential after node N1 is precharged and bootstrapped. That is, in almost all case, Vx=Vcc and node N1 is precharged by $V_x-V_t$ (where $V_t$ is a threshold voltage) prior to activating px to Vpp after elapsing a predetermined time Td. Thus, node N1 is bootstrapped by a voltage more than Vpp-Vt, so that voltage Vpp of a signal px for selectively operating sub word line SWL is transferred to the sub word line unchanged via pull-up transistor MN1.

FIG. 2 is a timing chart applied for driving the sub word line shown in FIG. 1.

The conventional sub word line driving circuit has as much time loss as much as the predetermined time Td delay, and exerts a bad influence upon the reliability of pull-up transistor MN1 due to node N1 under transition to the higher voltage.

SUMMARY OF THE INVENTION

Accordingly, the present invention is directed to a semiconductor memory device having a hierarchical word line structure that substantially obviates one or more of the problems due to limitations and disadvantages of the related art.

An object of the present invention is to provide a a sub word line structure, wherein a sub word line is driven by using only two NMOS transistors for decreasing a layout area, and a semiconductor memory device using the same.

It is another object of the present invention to provide a sub word line structure for improving operating speed by eliminating time loss caused by a delay between driving signals which has been heretofore required during a bootstrapping process, and a semiconductor memory device using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the inventive sub word line driving circuit which includes a pull-up driver section coupled between a word line boosting signal and a sub word line and has a gate coupled to a main word line. Also, a pull-down driver section thereof is coupled between the sub word line and a ground voltage and has a gate coupled to a main word line bar.

Alternatively, a sub word line driving circuit according to the present invention includes a pull-up driver section coupled between a main word line and a sub word line and having a gate coupled to a pxi potential, and a pull-down driver section coupled between the sub word line and a ground voltage and having a gate coupled to a /pxi potential.

In a semiconductor memory device including a cell array formed of a plurality of rows and columns, a row decoder and a column decoder for respectively selecting rows and columns in accordance with addresses, to achieve the above object of the present invention, a hierarchical word line structure has sub word line driving circuits numbering $2^m$ per sub word line group obtained by classifying respective cell arrays into n sub cell blocks in the column direction and classifying sub word lines of respective sub cell blocks by $2^m$, and main word line and main word line bar provided in the row direction. Here, the semiconductor memory device includes the row decoder section for providing the main word line and main word line bar by receiving the row address of one portion. In addition, a word line boosting signal generating section receives remaining row addresses numbering m as an input for producing $2^m$ word line boosting signals, and a plurality of sub word line driving drive the sub word lines in accordance with potential signals of the main word line and main word line bar.

An alternative to this is a semiconductor memory device which includes a cell array formed of a plurality of rows and columns, a row decoder and a column decoder for respectively selecting rows and columns in accordance with addresses with respect to a hierarchical word line structure having sub word line driving circuits numbering $2^m$ per sub word line group obtained by classifying respective cell arrays into n sub cell blocks in the column direction and classifying sub word lines of respective sub cell blocks by $2^m$, and a main word line provided in the row direction. Here, the semiconductor memory device includes the row decoder section for providing the main word line by receiving the row address of one portion, a word line boosting signal generating section for receiving remaining row addresses numbering m as an input for producing word line boosting signal and word line boosting signal bar by $2^m$. In addition to these, a plurality of sub word line driving sections drive the sub word lines in accordance with the word line boosting signal and word line boosting signal bar.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Reference will now be made in detail to a preferred embodiment of the present invention, examples of which are illustrated in the accompanying drawings.

A sub word line driving circuit and a semiconductor memory device using the same according to the present invention will be described in detail with reference to accompanying drawings.

Figure 1:
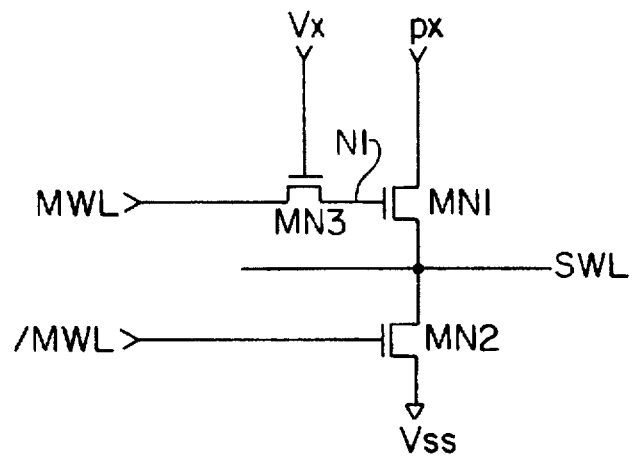
FIG. 1 is a detailed circuit diagram showing a conventional sub word line driving circuit.
Figure 2:
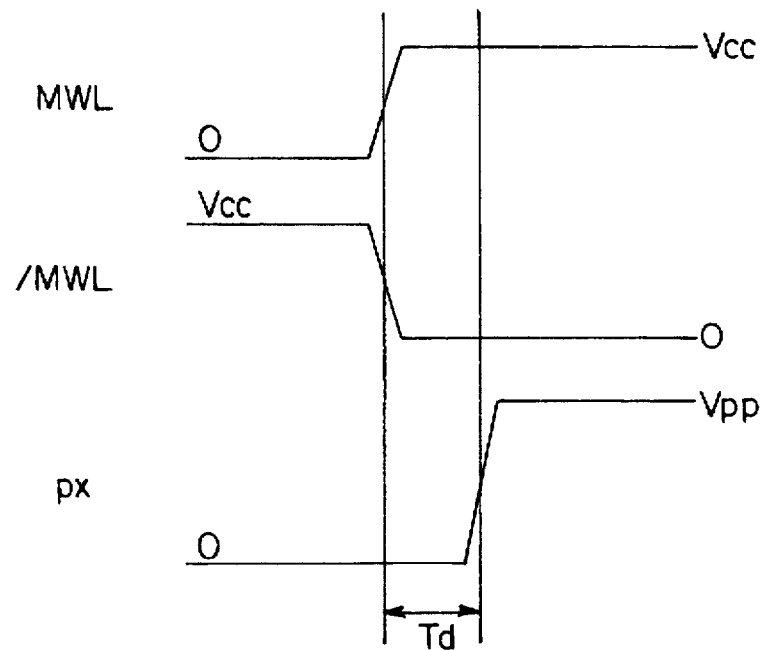
FIG. 2 is an operational timing chart of the sub word line driving circuit shown in FIG. 1.
Figure 3:
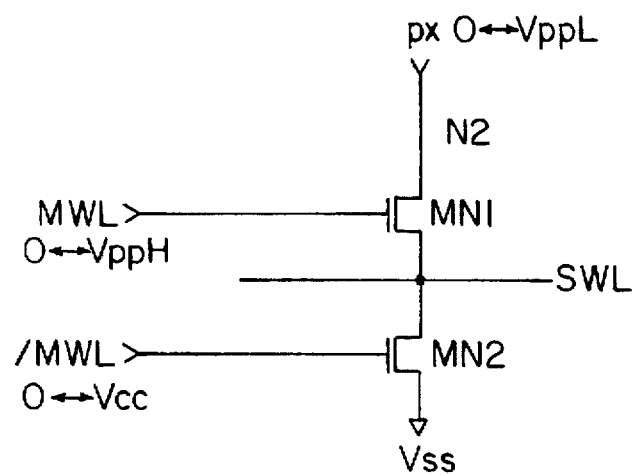
FIG. 3 is a detailed circuit diagram showing a sub word line driving circuit according to a first embodiment of the present invention.

FIG. 3 is a detailed circuit diagram showing the sub word line driving circuit according to a first embodiment of the present invention. Here, the circuit includes an NMOS transistor MN1 coupled between a node N2 for receiving a px potential and a sub word line SWL and having a gate coupled to a main word line MWL. Also, an NMOS transistor MN2 coupled between sub word line SWL and a ground voltage Vss has a gate coupled to a complement main word line /MWL.

The sub word line driving circuit is formed by two NMOS transistors MN1 and MN2, in which pull-up transistor MN1 serves the pull-up function for transmitting a voltage level of Vpp low VppL to sub word line SWL, and pull-down transistor MN2 pulls down sub word line SWL to 0 V of ground voltage.

Figure 4:
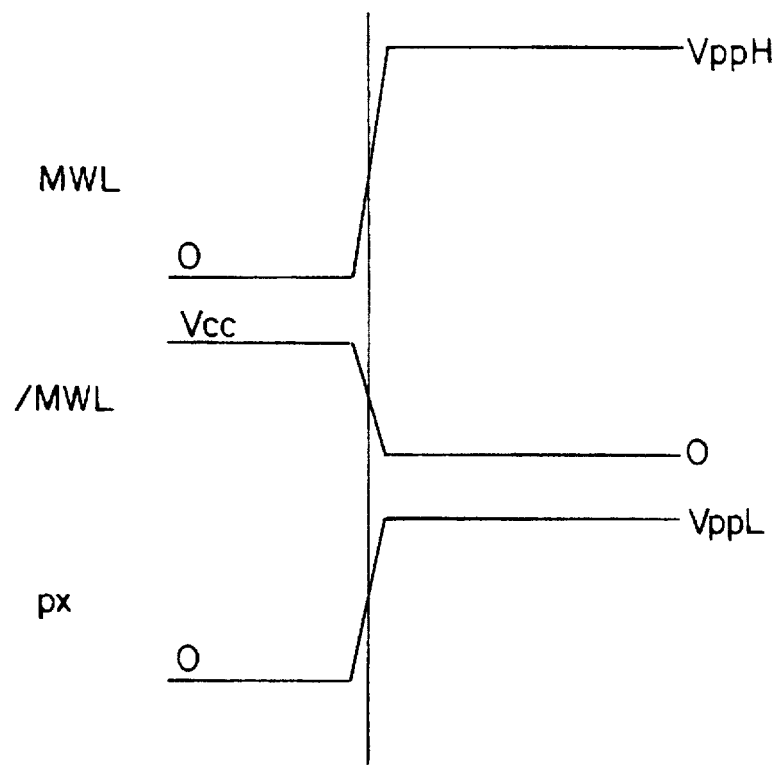
FIG. 4 is an operational timing chart of the sub word line driving circuit shown in FIG. 3.

FIG. 4 is an operational timing chart applied for driving the sub word line driving circuit shown in FIG. 3. Different from the conventional sub word line driving circuit, there is no time delay between main word line MWL & complement main word line /MWL and signal px. In order to operate the circuit according to the present invention, boosted voltage levels of VppH and VppL are required. At this time, VppH is a voltage level required for activating the sub word line, and VppH is a voltage supplied to the gate of pull-up transistor MN1 for transmitting the VppL voltage of px to the sub word line unchanged (i.e., VppH>VppL+Vt).

Figure 5:
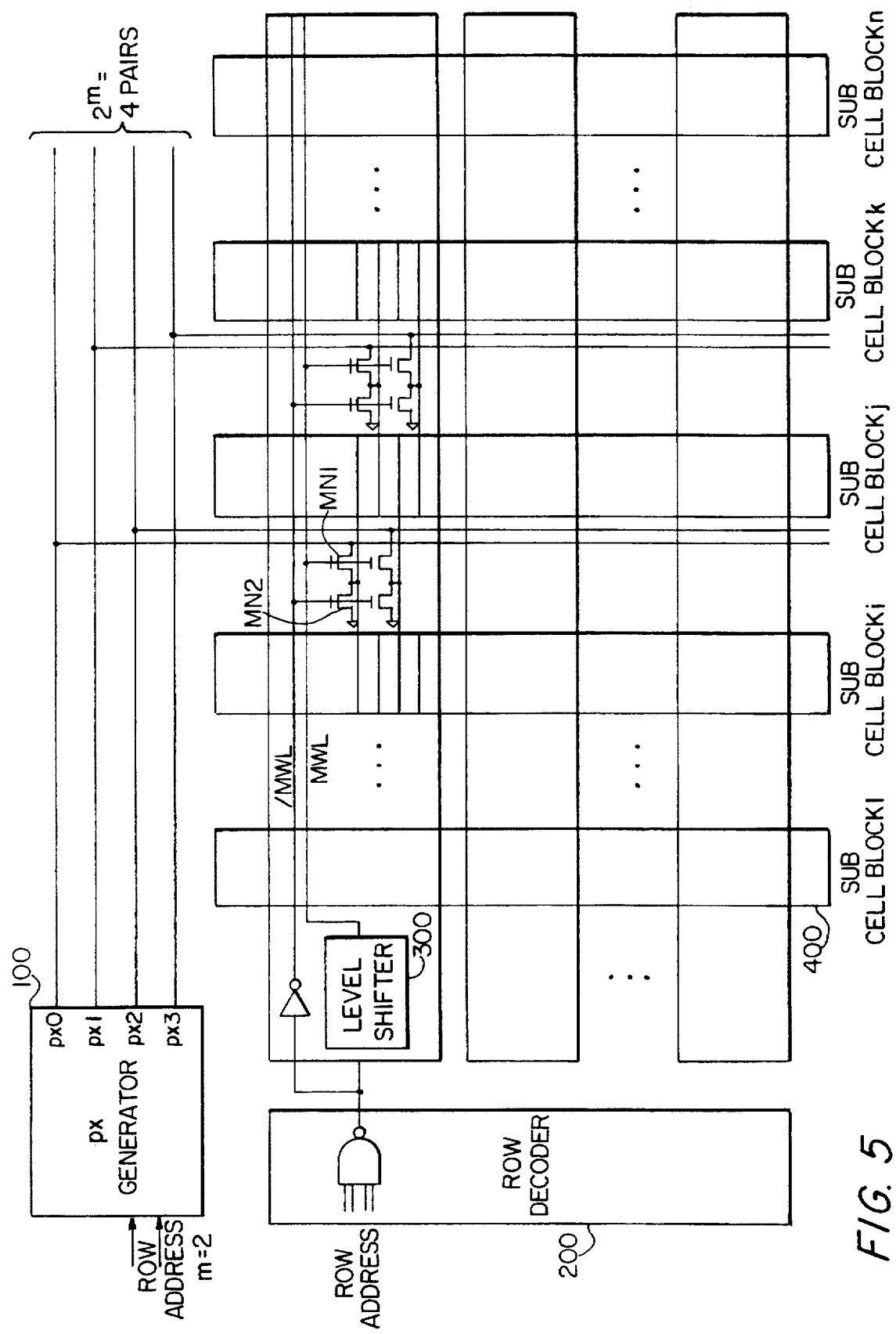
FIG. 5 shows a first embodiment of applying the sub word line driving circuit shown in FIG. 3 to an overall cell array.

FIG. 5 shows a first embodiment of applying the sub word line driving circuit shown in FIG. 3 to an overall cell array. Here, sub word lines SWL are classified as respective groups by four. In addition, since two main word lines MWL and complement word line /MWL metal line pass over the group of four sub word lines of poly-silicon, metal pitch is increased twice as compared with the conventional metal strapping method. A row decoder 200 receives a row address of one portion as an input for activating main word line MWL corresponding to the address signal. Main word line MWL selected in accordance with the row address is driven by VppH at 0 V via a level shifter 300, and a px generator 100 receives two row addresses as inputs for driving only pxi (where i is a constant and $0 \leq i \leq 3$) of the corresponding address with VppL at 0 V. Sub word line driving circuits are placed on both sides of respective sub cell blocks i (where $1 \leq i \leq n$), a first one of which is indicated as element 400.

Figure 6:
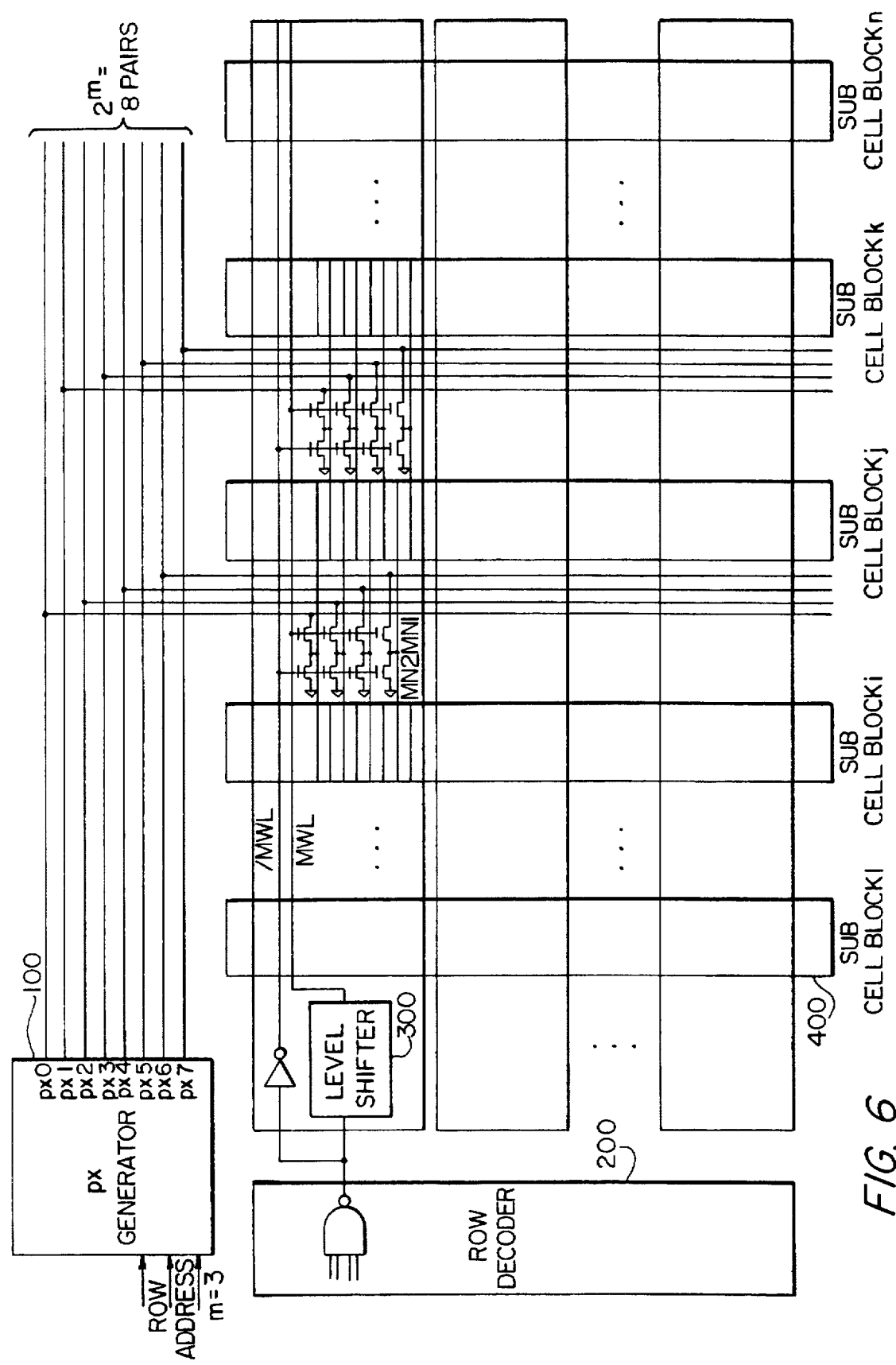
FIG. 6 shows a second embodiment of applying the sub word line driving circuit shown in FIG. 3 to the overall cell array.

FIG. 6 shows a second embodiment of applying the sub word line driving circuit shown in FIG. 3 to the overall cell array, in which the metal pitch is increased four times over the conventional metal strapping method since every eight sub word lines SWL are classified as respective groups and two main word lines MWL and complement main word line /MWL metal line pass over the eight sub word line groups of poly-silicon. Row decoder 200 receives the row address of one portion as an input for activating the main word line MWL corresponding to the address signal.

Main word line MWL selected in accordance with the row address is driven by VppH at 0 V via level shifter 300, and px generator 100 receives three row addresses as inputs for driving only pxi (where i is a constant, and $0 \leq i \leq 7$) of corresponding address with VppL at 0 V. The sub word line driving circuits are placed on both sides of respective sub cell blocks i (where $1 \leq i \leq n$), a first one of which is indicated as element 400.

Figure 7:
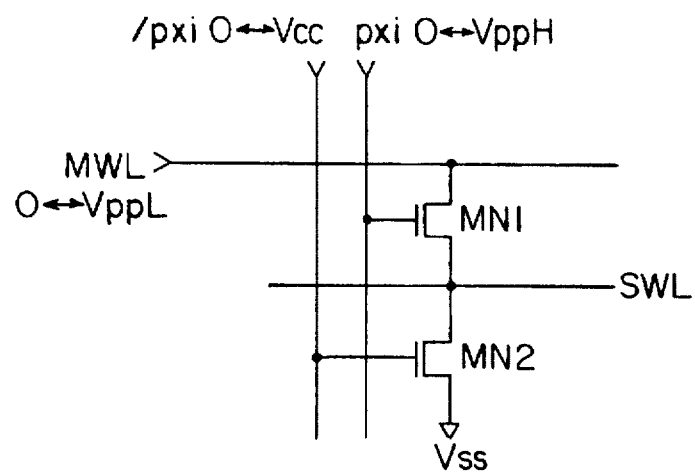
FIG. 7 is a detailed circuit diagram showing the sub word line driving circuit according to a second embodiment of the present invention.

FIG. 7 is a detailed circuit diagram showing the sub word line driving circuit according to a second embodiment of the present invention. Here, the circuit includes an NMOS transistor MN1 coupled between main word line MWL and sub word line SWL and having a gate coupled to a true pxi potential line, and an NMOS transistor MN2 coupled between sub word line SWL and ground voltage Vss and having a gate coupled to complement /pxi potential line. Different from the circuit of the first embodiment, the circuit has no complement main word line /MWL signal, and the sub word line is driven by main word line MWL and two signals pxi and /pxi.

Figure 8:
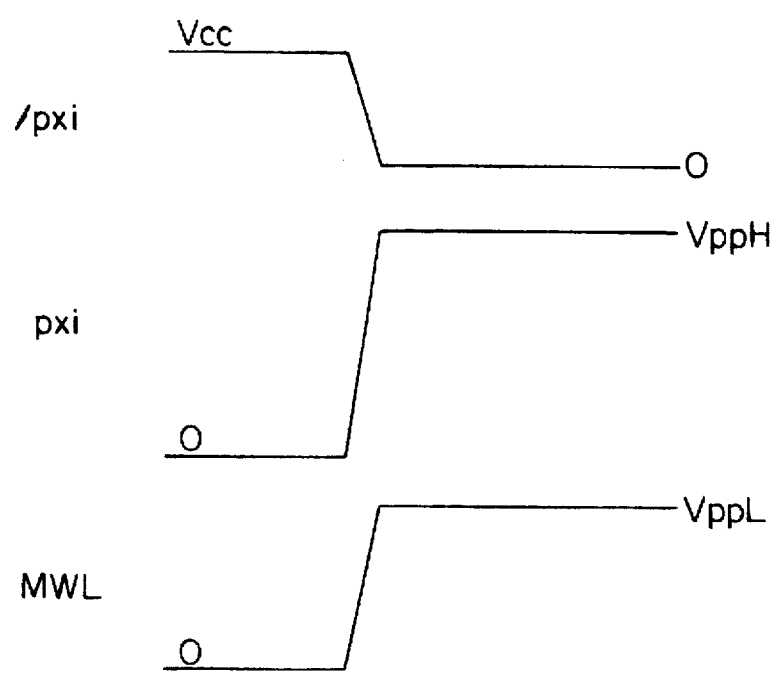
FIG. 8 is an operational timing chart of the sub word line driving circuit shown in FIG. 7.

FIG. 8 is an operational timing chart of the sub word line driving circuit shown in FIG. 7. This circuit includes two NMOS transistors MN1 and MN2 as the first embodiment, in which pull-up transistor MN1 is on/off by the pxi signal, and serves the pull-up function for transmitting the VppL voltage of main word line MWL to sub word line SWL. Meantime, pull-down transistor MN2 is on/off by the /pxi signal, and pulls down the sub word line to 0 V. The pxi signal has the voltage level of VppH on 0 V when it is not activated, and main word line MWL has the voltage level of VppL on 0 V.

Figure 9:
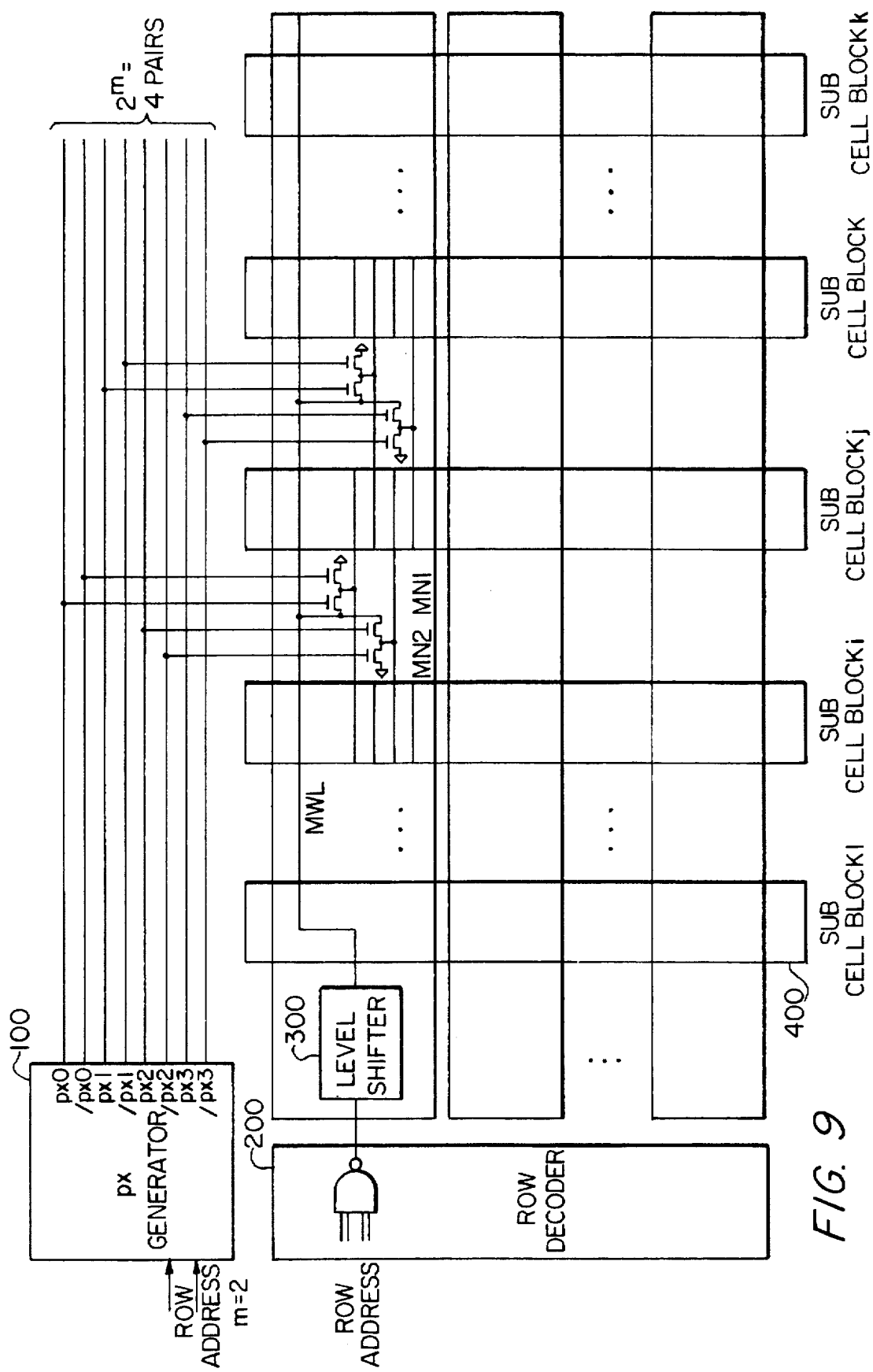
FIG. 9 shows a third embodiment of applying the sub word line driving circuit shown in FIG. 7 to the overall cell array.

FIG. 9 shows a third embodiment of applying the sub word line driving circuit shown in FIG. 7 to the overall cell array. Here, the metal pitch is increased four times over the conventional metal strapping method since four sub word lines are classified as respective groups, and a single main word line MWL metal line passes over four sub word lines of poly-silicon. Row decoder 200 receives a row address of one portion as an input to activate main word line MWL corresponding to the address signal.

Main word line MWL selected by the row address is driven by VppL at 0 V via level shifter 300, and px generator 100 receives two row addresses for driving only pxi and /pxi (where i is a constant, and $0 \leq i \leq 3$) of corresponding address. At this time, pxi becomes VppH at 0 V and /pxi becomes 0 V at Vcc. Sub word line driving circuits are placed on both sides of respective sub cell blocks i, a first one of which is indicated as element 400.

When the sub word line driving circuit according to the present invention as described above is embodied into VLSI products of Gigabit class, the sub word line is driven only by two NMOS transistors to decrease the overall area of the memory device. Furthermore, there is no time loss caused by delay between the driving signals which has been heretofore required in the bootstrapping process to involve high operating speed and to be favorable for a reliability aspect of the device.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. In a semiconductor memory device having a hierarchical word line structure, a sub word line driving circuit comprising:

a pull-up driver that receives a word line boosting signal, is coupled to a sub word line, and has a gate directly connected to a main word line; and a pull-down driver that is coupled between said sub word line and a ground voltage, and has a gate coupled to a main word line bar.

2. A sub word line driving circuit as claimed in claim 1, wherein:

said pull-up driver and pull-down driver include respective MOS transistors.

3. A sub word line driving circuit as claimed in claim 2, wherein:

said MOS transistors are NMOS transistors.

4. In a semiconductor memory device having a hierarchical word line structure, a sub word line driving circuit comprising:

a pull-up driver that receives a word line boosting signal, is coupled to a sub word line, and has a gate directly connected to a main word line; and a pull-down driver that is coupled between said sub word line and a ground voltage, and has a gate coupled to a main word line bar;

wherein said pull-up driver includes a transistor having a threshold voltage smaller than a difference between main word line signals and the word line boosting signal.

5. A semiconductor memory device comprising:

a cell array formed of a plurality of rows and columns;

a column decoder for selecting columns in accordance with column addresses;

a hierarchical word line structure having sub word line groups that each have $2^m$ sub word line driving circuits, the sub word line groups being obtained by dividing respective cell arrays into n sub cell blocks in a column direction and by associating sets of $2^m$ sub word lines with respective sub cell blocks;

main word line and main word line bar signals provided on respective main word lines and main word line bar lines in a row direction;

a row decoder for providing said main word line and main word line bar signals in accordance with a first portion of row addresses, word line boosting signal generating means for receiving m remaining bits of the row addresses other than the first portion of the row addresses, and for producing $2^m$ word line boosting signals; and the $2^m$ sub word line driving circuits for driving said sub word lines in accordance with said main word line and said word line bar signals, wherein a said sub word line driving circuit from among the $2^m$ sub word line driving circuits includes:

a) a pull-up driver that is coupled between the word line boosting signal and the sub word line, and has a gate directly connected to the main word line; and b) a pull-down driver that is coupled between the sub word line and ground voltage, and has a gate coupled to said main word line bar.

6. A semiconductor memory device as claimed in claim 5, wherein:

n and m are natural numbers.

7. A semiconductor memory device as claimed in claim 5, wherein:

said $2^m$ word line boosting signals are commonly shared by said plurality of sub word line driving circuits.

8. A semiconductor memory device as claimed in claim 5, wherein:

said pull-up driver and pull-down driver include MOS transistors.

9. A semiconductor memory device as claimed in claim 8, wherein said MOS transistors are NMOS transistors.

10. A semiconductor memory device as claimed in claim 8, wherein said pull-up driver includes:

a transistor having a threshold voltage smaller than a difference between the main word line signals and the word line boosting signals.

11. A semiconductor memory device comprising:

a cell array formed of a plurality of rows and columns;

a column decoder for selecting columns in accordance with column addresses;

a hierarchical word line structure having sub word line groups that each have $2^m$ sub word line driving circuits, the sub word line groups being obtained by dividing respective cell arrays into n sub cell blocks in a column direction and by associating sets of $2^m$ sub word lines with respective sub cell blocks;

main word line and main word line bar signals provided on respective main word lines and main word line bar lines in a row direction;

a row decoder for providing said main word line and main word line bar signals in accordance with a first portion of row addresses;

word line boosting signal generating means for receiving m remaining bits of the row addresses other than the first portion of the row addresses, and for producing $2^m$ word line boosting signals; and the $2^m$ sub word line driving circuits for driving said sub word lines in accordance with said main word line and said word line bar signals;

wherein:

said main word line is driven by a ground potential and a high logic level of high potential, and said word line boosting signal generating means provides said ground potential and a low logic level of high potential.

12. A semiconductor memory device as claimed in claim 11, wherein:

n and m are natural numbers.

13. A semiconductor memory device as claimed in claim 11, wherein:

said $2^m$ word line boosting signals are commonly shared by said plurality of sub word line driving circuits.

14. A semiconductor memory device as claimed in claim 11, wherein a said sub word line driving circuit from among the $2^m$ sub word line driving circuits includes:

a) a pull-up driver coupled between said word line boosting signal and said sub word line, and having a gate directly connected to said main word line;

and b) a pull-down driver coupled between said sub word line and ground voltage, and having a gate coupled to said main word line bar.

15. A semiconductor memory device as claimed in claim 14, wherein:

said pull-up driver and pull-down driver include MOS transistors.

16. A semiconductor memory device as claimed in claim 15, wherein said MOS transistors are NMOS transistors.

17. A semiconductor memory device as claimed in claim 15, wherein said pull-up driver includes:

a transistor having a threshold voltage smaller than a difference between the main word line signals and the word line boosting signals.

* * * * *